United States Patent
Kim

(10) Patent No.: US 9,871,899 B2
(45) Date of Patent: Jan. 16, 2018

(54) DISPLAY DEVICE

(71) Applicant: Hyeong-Gwon Kim, Yongin (KR)

(72) Inventor: Hyeong-Gwon Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 1077 days.

(21) Appl. No.: 13/919,033

(22) Filed: Jun. 17, 2013

(65) Prior Publication Data

US 2014/0153266 A1    Jun. 5, 2014

(30) Foreign Application Priority Data

Dec. 4, 2012 (KR) .......................... 10-2012-0139709

(51) Int. Cl.
| | | |
|---|---|---|
| H05K 1/00 | (2006.01) |
| H04M 1/02 | (2006.01) |
| G09F 9/30 | (2006.01) |
| H05K 1/18 | (2006.01) |
| H05K 7/00 | (2006.01) |
| H05K 1/11 | (2006.01) |
| H05K 1/14 | (2006.01) |
| H05K 3/46 | (2006.01) |

(52) U.S. Cl.
CPC .......... *H04M 1/0268* (2013.01); *G09F 9/301* (2013.01); *H04M 1/0277* (2013.01); *H05K 1/118* (2013.01); *H05K 1/147* (2013.01); *H05K 1/185* (2013.01); *H05K 3/4691* (2013.01); *H05K 2201/05* (2013.01); *H05K 2201/10* (2013.01); *H05K 2201/10681* (2013.01)

(58) Field of Classification Search
CPC ... G09F 9/301; H04M 1/0268; H04M 1/0277; H05K 2201/05; H05K 2201/10681; H05K 1/185; H05K 2201/10; H05K 1/118; H05K 1/147; H05K 1/148; H05K 3/4691; G02F 1/13452; H01L 2224/50; H01L 2224/79; H01L 2224/86; H01L 2225/06579; H01L 2225/107
USPC ....... 361/783, 749, 784, 752, 760, 761, 762, 361/764, 789; 362/418; 349/149, 150
See application file for complete search history.

(56) References Cited

U.S. PATENT DOCUMENTS

| | | | | |
|---|---|---|---|---|
| 6,342,932 B1 * | 1/2002 | Terao | .................. | G02F 1/13452 349/150 |
| 2004/0183984 A1 * | 9/2004 | Imajo | .................. | G02F 1/13452 349/151 |
| 2007/0126721 A1 * | 6/2007 | Kurokawa | ............ | G06F 3/1431 345/204 |
| 2010/0060601 A1 * | 3/2010 | Oohira | .............. | G02F 1/133308 345/173 |

(Continued)

FOREIGN PATENT DOCUMENTS

| | | | |
|---|---|---|---|
| KR | 10 2004-0100395 A | 12/2004 |
| KR | 10 2005-0021620 A | 3/2005 |
| KR | 10 2008-0005735 A | 1/2008 |

*Primary Examiner* — Binh Tran
(74) *Attorney, Agent, or Firm* — Lee & Morse P.C.

(57) ABSTRACT

A display device includes a flexible display panel for displaying an image, and a printed circuit board electrically connected with the flexible display panel through a circuit film. The printed circuit board may include a plurality of boards in a stack, the boards being respectively provided with integrated circuits, driving chips, and circuit wires, and a conducting portion connecting circuit wires of at least two boards among the plurality of boards.

13 Claims, 6 Drawing Sheets

(56) References Cited

U.S. PATENT DOCUMENTS

| | | | |
|---|---|---|---|
| 2013/0088671 A1* | 4/2013 | Drzaic | G02F 1/13452 349/106 |
| 2013/0107476 A1* | 5/2013 | Wright | G09G 3/3208 361/752 |
| 2014/0140018 A1* | 5/2014 | Malek | H04M 1/0277 361/749 |

* cited by examiner

DISPLAY DEVICE

CROSS-REFERENCE TO RELATED APPLICATION

This application claims priority to and the benefit of Korean Patent Application No. 10-2012-0139709 filed in the Korean Intellectual Property Office on Dec. 4, 2012, and entitled: "DISPLAY DEVICE," which is incorporated by reference herein in its entirety.

BACKGROUND

1. Field

Embodiments relate to a display device.

2. Description of the Related Art

A display device may be provided with a flexible display panel that can be easily bent. A flexible display panel may have a structure in which a plurality of signal lines and a plurality of pixels are disposed on a flexible substrate such as a polymer film, and displays an image using light emitted from the plurality of pixels.

The above information disclosed in this Background section is only for enhancement of understanding of the background of the described technology and therefore it may contain information that does not form the prior art that is already known in this country to a person of ordinary skill in the art.

SUMMARY

Embodiments are directed to a display device, including a flexible display panel for displaying an image, and a printed circuit board electrically connected with the flexible display panel through a circuit film. The printed circuit board may include a plurality of boards in a stack, the boards being respectively provided with integrated circuits, driving chips, and circuit wires, and a conducting portion connecting circuit wires of at least two boards among the plurality of boards.

The conducting portion may include a conductive filler penetrating one of the plurality of boards, a wiring layer formed on the conductive filler, and a conductive member provided between a circuit wire formed in another board among the plurality of boards and the wiring layer.

The conductive filler and the conductive member may be provided in plural in a thickness direction of the printed circuit board, and a plurality of the conducting portions may connect circuit wires provided in three or more boards among the plurality of boards.

The conductive member may be formed of an anisotropic conductive film.

The printed circuit board may include an insulation filler filling a space between two neighboring boards among the plurality of boards.

The two outermost boards of the plurality of boards may have the integrated circuit and the driving chip at a single side that faces an inner side of the printed circuit board, and other boards among the plurality of boards may have the integrated circuit and the driving chip at any side thereof.

Two neighboring boards among the plurality of boards may have the integrated circuit and the driving chip at sides that face each other, and the integrated circuit and the driving chip of one of the two neighboring boards may be formed in a location that is different from a location of the integrated circuit and the driving chip of the other of the two neighboring boards.

The printed circuit board may include a connection board disposed as one of the outermost boards among the plurality of boards, and the connection board may have a plurality of pad electrodes for connection with the circuit film and a connector for receiving an external signal.

The connection board may have a plurality of circuit wires connected with the circuit wires of other boards among the plurality of boards in addition to the circuit wire formed at the side that faces the inner side of the printed circuit board.

The plurality of pad electrodes may be formed at an outer side of the connection board, and the plurality of circuit wires formed in the connection board may be respectively connected to the plurality of pad electrodes by a conductive filler penetrating the connection board.

The integrated circuit may include one or more of a timing controller, a power management, a DC-DC converter, a level shifter, an EEPROM, or a gamma IC, and the driving chip may include one or more of a resistor, an inductor, or a capacitor.

The flexible display panel may have a display side, the printed circuit board may be disposed overlapping the flexible display panel at a side opposite of the display side, and the circuit film may be bent toward the opposite side of the flexible display panel.

The flexible display panel may be an organic light emitting display panel that includes an organic light emitting diode.

BRIEF DESCRIPTION OF THE DRAWINGS

Features will become apparent to those of skill in the art by describing in detail example embodiments with reference to the attached drawings in which.

DETAILED DESCRIPTION

Figure 1:
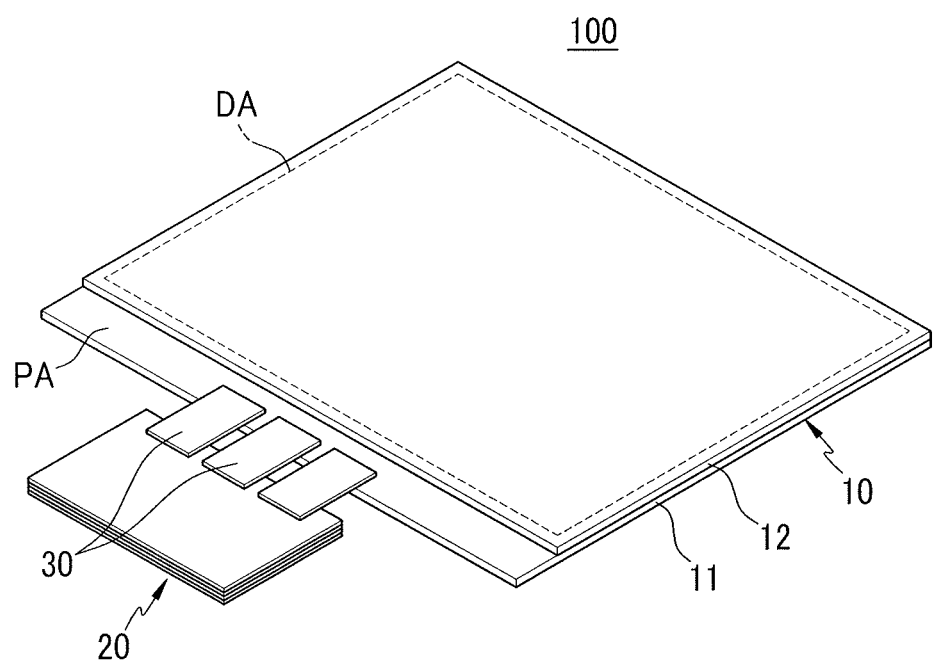
FIG. 1 and FIG. 2 are perspective views of a display device according to an example embodiment.

Example embodiments will now be described more fully hereinafter with reference to the accompanying drawings, however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

In the specification, unless explicitly described to the contrary, the word "comprise" and variations such as "comprises" or "comprising", will be understood to imply the inclusion of stated elements but not the exclusion of any other elements. In addition, the word "on" means positioning on or below the object portion, but does not essentially mean positioning on the upper side of the object portion based on a gravity direction.

Figure 2:
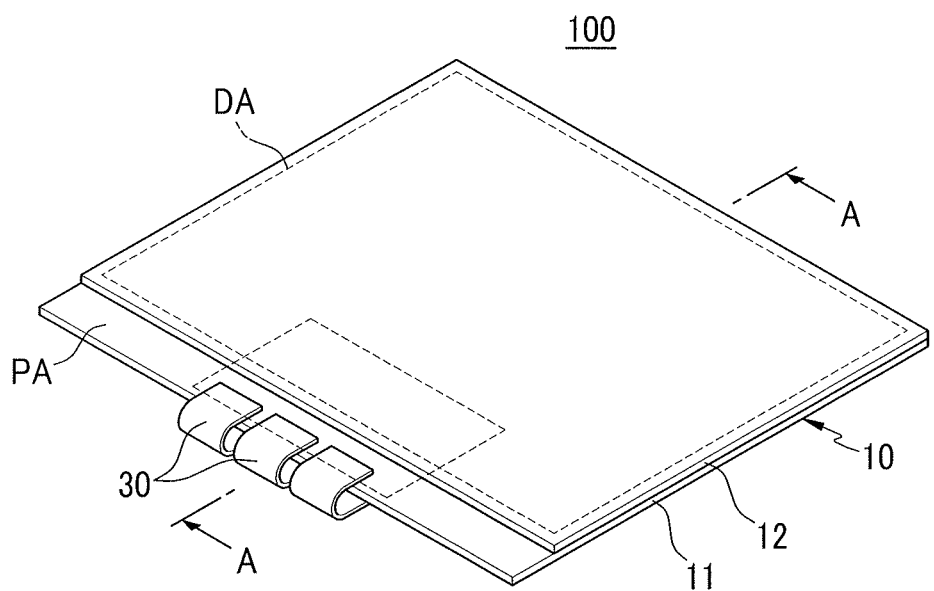
Figure 3:
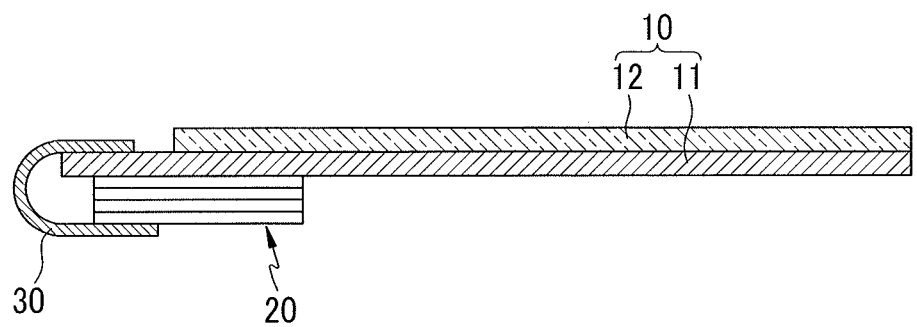
FIG. 3 is a cross-sectional view of the display device of FIG. 2, cut along the line A-A.

FIG. 1 and FIG. 2 are perspective views of a display device according to an example embodiment and FIG. 3 is a cross-sectional view of the display device of FIG. 2, taken along the line A-A.

In the example embodiment shown in FIG. 1 to FIG. 3, a display device 100 includes a flexible display panel 10 for displaying an image, a printed circuit board 20 where a control circuit that transmits a control signal to the flexible display panel 10 is formed, and a circuit film 30 connecting the flexible display panel 10 and the printed circuit board 20.

The flexible display panel 10 may include a first substrate 11 provided with a display area DA and a pad area PA, and a second substrate 12 attached onto the first substrate 11 to cover the display area DA. The first substrate 11 and the second substrate 12 are formed of a flexible substrate such as a polymer film. The flexible display panel 10 may be an organic light emitting display panel that includes an organic light emitting diode (OLED).

A plurality of signal lines (including scan lines and data lines) and a plurality of pixels are provided in the display area DA of the first substrate 11, and a plurality of pad electrodes (not shown) are disposed in the pad area PA. In addition, a scan driver (not shown) and a data driver (not shown) are provided in an outer side of the display area DA. The scan driver supplies scan signals to the plurality of pixels through the scan lines, and the data driver supplies data signals to the plurality of pixels through the data lines.

The second substrate 12 is smaller than the first substrate 11 in size, and is attached to the display area DA of the first substrate by a sealing member (not shown) coated along the edge of the second substrate 12. As a sealing substrate, the second substrate 12 protects the plurality of pixels from an external environment that contains moisture and oxygen by sealing the plurality of pixels together with the sealing member.

A pixel circuit and an internal structure of the flexible display panel 10 will be described below.

The circuit film 30 is formed of an insulation film such as polyimide where a wiring pattern is formed. The circuit film 30 may be formed of a flexible printed circuit film, or a chip on film or tape carrier package provide with an integrated circuit chip.

One end of the circuit film 30 is fixed to the pad area PA and thus electrically connected with pad electrodes, and the other end of the circuit from 30 is fixed to the printed circuit board 20 and thus electrically connected with wires of the printed circuit board 20. A control signal of the printed circuit board 20 is transmitted to the flexible display panel 10 to realize an image in the display area DA.

When light of the flexible display panel 10 is passed through the second substrate 12 and then emitted to the outside, the circuit film 30 is bent toward a rear side of the first substrate 11 and the printed circuit board 20 is disposed in a rear side of the first substrate 11. On the other hand, when light of the flexible display panel 10 is passed through the first substrate 11 and then emitted to the outside, the circuit film 30 is bent toward a front side of the second substrate 12 and the printed circuit board 20 is disposed in a front side of the second substrate 12. FIG. 2 and FIG. 3 exemplarily illustrate the first case.

In the present example embodiment, the circuit film 30 is bent toward the opposite of a display side of the flexible display panel 10, and the printed circuit board 20 overlaps the flexible display panel 10 at the opposite side of the display side of the flexible display panel 10, and thus the entire size of the display device 100 is reduced (refer to FIG. 2). In an implementation, if the printed circuit board 20 is not bendable, an area of the flexible display panel 10, which overlaps the printed circuit board 20, is not bent.

In the display device 100 of the present example embodiment, the printed circuit board 20 has a layered structure so that the entire size of the display device can be reduced while providing a sufficient number of integrated circuit elements and driving chips. Thus, the display device 100 increases a bendable area of the flexible display panel 10 by minimizing the size of the area that overlaps the printed circuit board 20.

Figure 4:
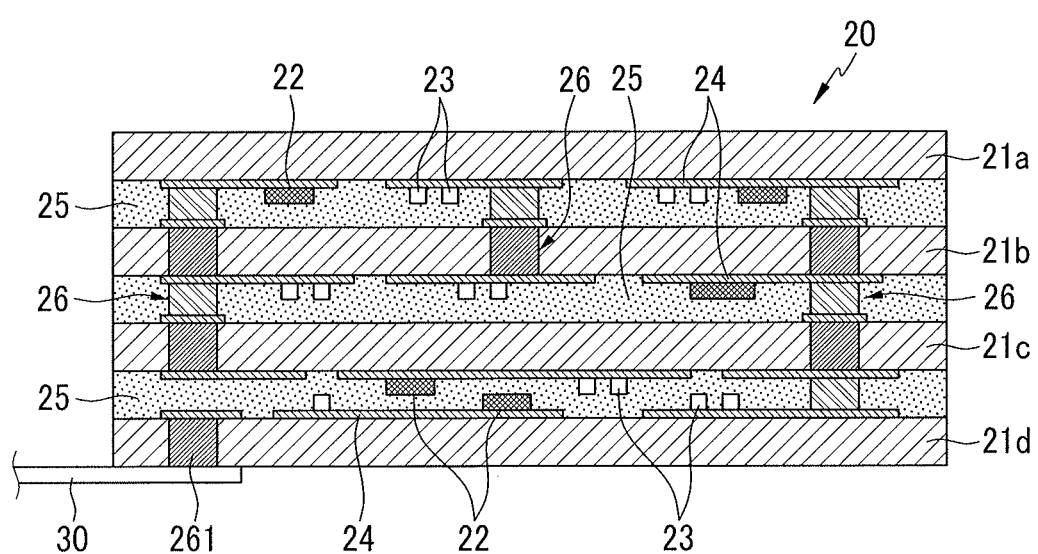
FIG. 4 is an enlarged view of a flexible printed circuit board of FIG. 3.
Figure 5:
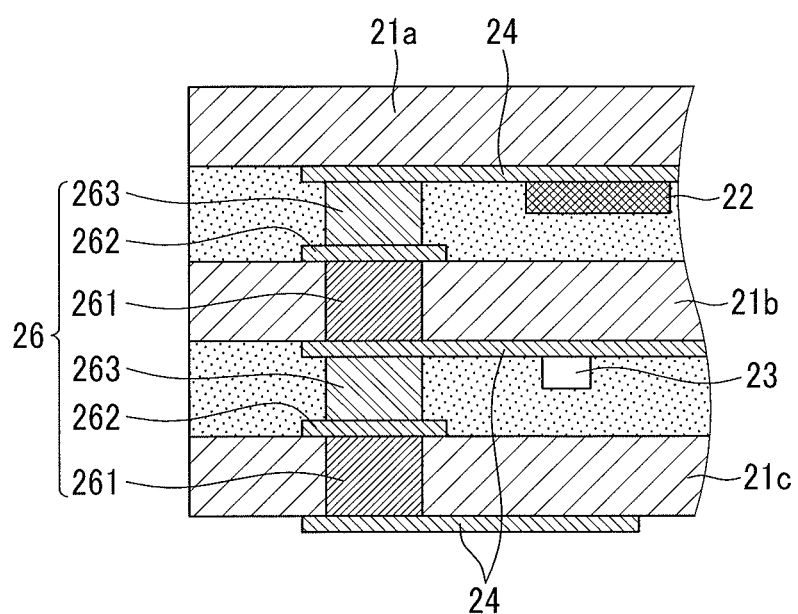
FIG. 5 is a partially enlarged view of the flexible printed circuit board of FIG. 4.

FIG. 4 is an enlarged view of the printed circuit board of FIG. 3 and FIG. 5 is a partially enlarged view of the printed circuit board of FIG. 4.

Referring to FIG. 4 and FIG. 5, the printed circuit board 20 includes a plurality of boards 21a, 21b, 21c, and 21d that are layered, and includes conducting portions 26 connecting circuit wires of at least two of the plurality of boards 21a, 21b, 21c, and 21d. FIG. 4 and FIG. 5 illustrate an example in which the printed circuit board 20 is formed of four boards 21a, 21b, 21c, and 21d, but the number of boards forming the printed circuit board 20 is not limited thereto.

Each of the plurality of boards 21a, 21b, 21c, and 21d may include one or more integrated circuit elements 22, one or more driving chips 23, and one or more circuit wires 24. The integrated circuit element 22 and the driving chip 23 are connected with the circuit wire 24. Each of the plurality of boards 21a, 21b, 21c, and 21d may be formed of a hard plate or a bendable film material.

The integrated circuit elements 22 may include a timing controller, a power management, a DC-DC converter, a level shifter, an electrically erasable programmable read-only memory (EEPROM), a gamma IC, and the like. The driving chips 23 may include electric elements such as a resistor, an inductor, a capacitor, and the like.

The number of integrated circuit elements 22 and the number of driving chips 23 provided in the printed circuit board 20 are increased as the size of the flexible display panel 10 is increased.

The two outermost boards 21a and 21d among the plurality of boards 21a, 21b, 21c, and 21d may have the integrated circuit 22 and the driving chip 23 disposed on one side facing an inner side of the printed circuit board 20. The other boards 21b and 21c may have the integrated circuit 22 and the driving chip 23 disposed on any side. In this case, since no electronic parts protrude toward the outer side from the printed circuit board 20, damage to the electronic parts may be avoided while transferring the printed circuit board 20 and an assembling it with other members.

In FIG. 4, for convenience, the plurality of boards will be called a first board 21a, a second board 21b, a third board 21c, and a fourth board 21d according to layering order. The first board 21a, the second board 21b, and the third board 21c may have the integrated circuits 22 and the driving chips 23 at sides that face the fourth board 21d, and the fourth board 21d may have the integrated circuit 22 and the driving chip 23 at one side that faces the first board 21a. In this case, the integrated circuits 22 and the driving chips 23 are disposed facing each other in the two neighboring boards (21c and 21d in FIG. 4). In this case, the integrated circuit 22 and the driving chip 23 formed in one board (e.g., the board 21c) and the integrated circuit 22 and the driving chip 23 formed in another board (e.g., the board 21d) may be disposed in different locations to avoid overlapping therebetween. For example, in FIG. 4, the integrated circuit 22 and the driving chip 23 formed in the third board 21c are disposed on a location that is different from a location of the integrated circuit 22 and the driving chip 23 formed in the fourth board 21d so that they do not overlap each other. Thus, physical collision between the electronic parts during a process for manufacturing the printed circuit board 20 can be prevented, and a layering thickness of the printed circuit board 20 can be reduced.

In the present example embodiment, the printed circuit board 20 includes an insulation filler 25 filling a space between two neighboring boards. The plurality of boards 21a, 21b, 21c, and 21d maintain a constant distance therebetween by the insulation filler 25, and they are integrally bonded to each other, thereby forming a single-layered structure. The insulation filler 25 may be formed of an epoxy resin.

The conducting portions 26 include a conductive filler 261 formed in a via hole that penetrates the board, a wiring layer 262 formed on the conductive filler 261, and a conductive member 263 provided between a circuit wire 24 of one board and a wiring layer 262 of another board for connection therebetween. The conductive member 263 may be formed of an anisotropic conductive film (ACF) having a plurality of conductive particles.

The conducting portion 26 can connect circuit wires 24 provided in three or more boards by increasing the number of conductive fillers 261 and the number of conductive members 263. In this case, two or more conductive fillers 261 and two or more conductive members 263 are provided along a thickness direction of the printed circuit board 20.

In FIG. 4, a conducting portion 26 connecting circuit wires 24 of the first, second, and third boards 21a, 21b, and 21c, a conducting portion 26 connecting circuit wires of the first and second boards 21a and 21b, and a conducting portion 26 connecting circuit wires 24 of the first to fourth boards 21a to 21d are illustrated as examples.

Since a circuit wire 24 of one board is electrically connected with a circuit wire 24 of another board, the printed circuit board 20 performs the same function of a conventional printed circuit board of which a plurality of integrated circuit elements, a plurality of driving chips, and a plurality of circuit wires are formed on one board.

Figure 6:
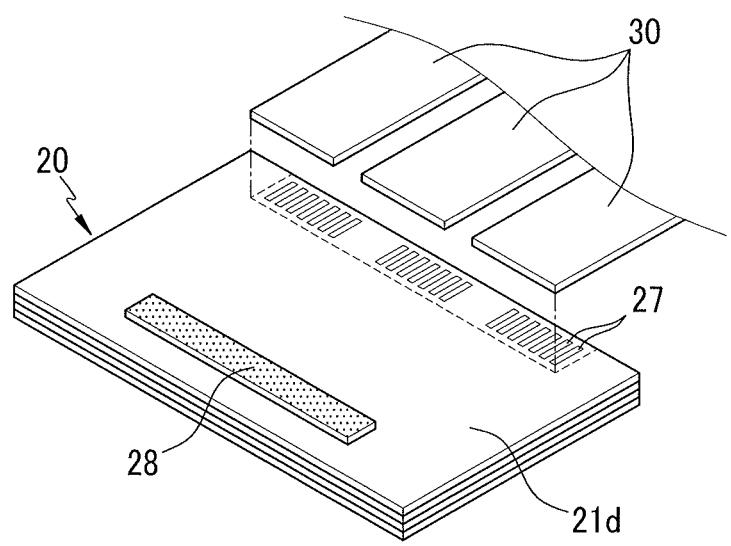
FIG. 6 is an exploded perspective view of a circuit film and the flexible printed circuit board of FIG. 1.

FIG. 6 is an exploded perspective view of the circuit film and the printed circuit board of FIG. 1.

Referring to FIG. 4 to FIG. 6, among the plurality of boards 21a, 21b, 21c, and 21d, one of the outermost boards 21a and 21d, for example, the board 21d, is provided with pad electrodes 27 and thus connected with the circuit film 30. For convenience of description, a board provided with the pad electrodes 27 is referred to as a connection board, and the fourth board 21d becomes the connection board in FIG. 4 and FIG. 6. A connector 28 is formed in the connection board 21d to receive an external signal.

In addition to the circuit wire 24 for the integrated circuit 22 and the driving chip 23 mounted in the connection board 21d, circuit wires connected with the plurality of integrated circuits 22 and the plurality of driving chips 23 mounted to the first board 21a to the third board 21c through the conducting portions 26 are additionally formed in the connection board 21c. In addition, the circuit wires formed in the connection board 21d are respectively connected with the pad electrodes 27.

The plurality of pad electrodes 27 may be provided at an inner side of the connection board 21d where the circuit wires 24 are formed, or may be formed at an outer side of the connection board 21d where the circuit wires 24 are not formed. FIG. 4 and FIG. 6 exemplarily illustrate the second case. In this case, the circuit wires of the connection board 21d are connected with the pad electrodes 27 by the conductive fillers 261 penetrating the connection board 21d. The pad electrodes 27 are connected with the circuit film by an anisotropic film (not shown).

The display device 100 of the present example embodiment can increase the size of the bendable area in the flexible display panel 10 by reducing the size of the printed circuit board 20 because the printed circuit substrate 20 has a structure in which the plurality of boards 21a, 21b, 21c, and 21d are layered. Therefore, bendability, which is an advantageous characteristic of the flexible display panel 10, can be demonstrated to the fullest, and merchantability of an electronic device employing the display device 100 can be increased.

In addition, the circuit wires 24 provided in the plurality of boards 21a, 21b, 21c, and 21d are electrically connected through the conducting portions 26, and therefore the printed circuit board 20 having the layered structure performs the same function of a printed circuit board formed of a single board, and signal attenuation and signal distortion can be minimized.

Figure 7:
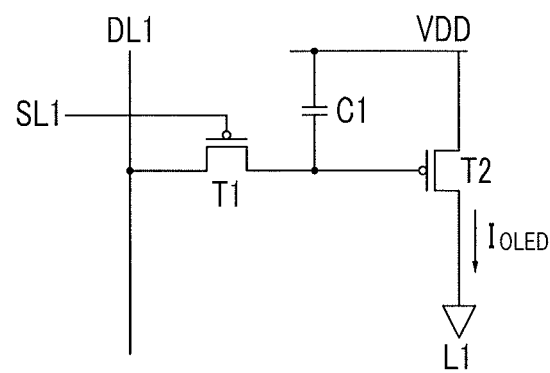
FIG. 7 is a layout view of a pixel circuit of a flexible display panel of FIG. 1.
Figure 8:
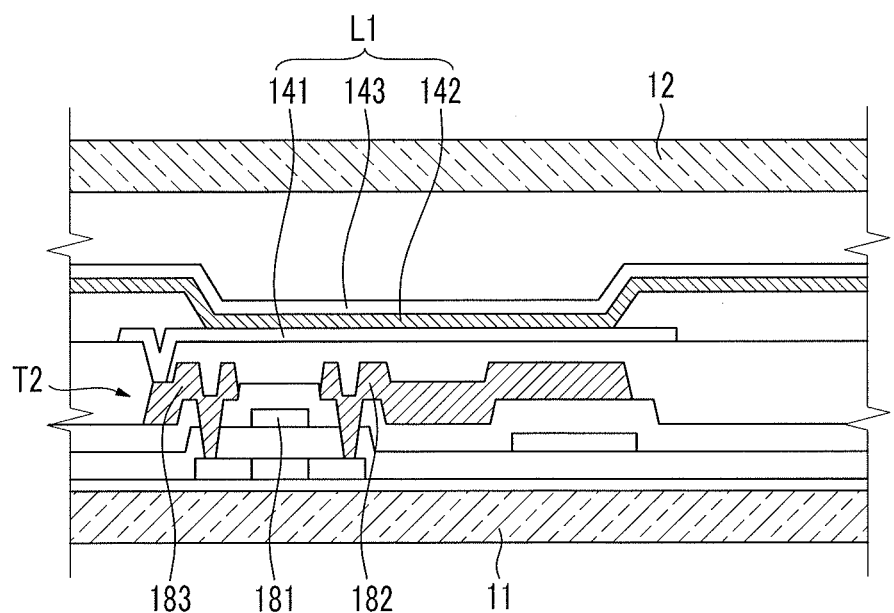
FIG. 8 is a partially enlarged cross-sectional view of the flexible display panel of FIG. 1.

FIG. 7 is a layout view of the pixel circuit of the flexible display panel of FIG. 1, and FIG. 8 is a partially enlarged cross-sectional view of the flexible display panel of FIG. 1.

Referring to FIG. 7 and FIG. 8, the pixel includes an organic light emitting diode L1 and driving circuits T1, T2, and C1. The organic light emitting diode L1 includes a pixel electrode 141, an organic emission layer 142, and a common electrode 143. The driving circuits T1, T2, and C1 include at least two thin film transistors (i.e., a switching transistor T1 and a driving transistor T2) and at least one capacitor C1.

The switching transistor T1 is connected to a scan line SL1 and a date line DL1, and transmits a data voltage input from the data line DL1 to a driving transistor T2 according to a switching voltage input to the scan line SL1. The capacitor C1 is connected to the switching transistor T1 and a power source line VDD, and stores a voltage corresponding to a difference between a voltage transmitted from the switching transistor T1 and a voltage supplied to the power source line VDD.

The driving transistor T2 is connected to the power source line VDD and the capacitor C1 and thus supplies an output current $I_{OLED}$ that corresponds to a square of a difference between the voltage stored in the capacitor C1 and a threshold voltage to the organic light emitting diode L1, and the organic light emitting diode L1 emits light with intensity that is proportional to the output current $I_{OLED}$. The driving transistor T2 includes a gate electrode 181, a source electrode 182, and a drain electrode 183, and the pixel electrode 141 may be connected to the drain electrode 183 of the driving transistor T2.

The pixel circuit of FIG. 7 and the cross-section structure of the flexible display panel of FIG. 8 are exemplarily illustrated, and the display device of the present example embodiment can be variously deformed.

By way of summation and review, a display device may include a printed circuit board (PCB) (where a control circuit that transmits a control signal to a flexible display panel is formed) and a circuit film connecting the flexible display panel and the printed circuit board. The circuit film may be bent toward a rear side (i.e., the opposite side of a display side) of the flexible display panel, and the printed circuit board may be overlapped with the flexible display panel such that the entire size of the display device can be reduced.

Bendability, which is an advantageous characteristic of the flexible display panel, may be offset due to the printed circuit board. Unlike the flexible display panel, the printed circuit board may not be bendable, and therefore an area in the flexible display panel that is overlapped with the printed circuit board cannot be bent. In addition, as the number of integrated circuits and the number of driving chips mounted to the printed circuit boards are increased as the size of the flexible display panel is increased, the size of the printed circuit board may increase.

As described above, embodiments relate to a display device provided with a flexible display panel. Embodiments may provide a display device that can increase a bendable area in a flexible display panel by reducing the size of a printed circuit board. Therefore, merchantability of an electronic device employing the display device may be increased by demonstrating bendability, which is an advantageous characteristic of the flexible display panel, to the fullest. The printed circuit board having the layered structure may perform the same function of a printed circuit board formed of a single board, and signal attenuation and signal distortion may be minimized.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 100: display device | 10: flexible display panel |
| 11: first substrate | 12: second substrate |
| 20: flexible printed circuit (FPC) | 30: circuit film |

What is claimed is:

1. A display device, comprising:
a flexible display panel including a plurality of pixels for displaying an image; and
a printed circuit board to control the flexible display panel, the printed circuit board being electrically connected with the flexible display panel through a circuit film, wherein the printed circuit board includes:
a plurality of boards that are stacked in a lamination form and in a vertical direction, the boards being respectively provided with integrated circuits, driving chips, and circuit wires,
a conducting portion connecting circuit wires of at least two boards among the plurality of boards, and
an insulation filler filling a space between two neighboring boards among the plurality of boards, wherein:
the circuit film includes a first portion coupled to the flexible display panel and a second portion coupled to the printed circuit board,
the circuit film is bent such that an edge portion of the flexible display panel is between the first and second portions of the circuit film in the vertical direction,
all the integrated circuits and all the driving chips are disposed between the plurality of boards and the insulation filler, and
a first integrated circuit and a first driving chip of one of the two neighboring boards are not overlapped with a second integrated circuit and a second driving chip of another of the two neighboring boards.

2. The display device as claimed in claim 1, wherein the conducting portion includes:
a conductive filler penetrating one of the plurality of boards,
a wiring layer formed on the conductive filler, and
a conductive member provided between a circuit wire formed in another board among the plurality of boards and the wiring layer.

3. The display device as claimed in claim 2, wherein the conductive filler and the conductive member are provided in plural in a thickness direction of the printed circuit board, and a plurality of the conducting portions connect circuit wires provided in three or more boards among the plurality of boards.

4. The display device as claimed in claim 2, wherein the conductive member is formed of an anisotropic conductive film.

5. The display device as claimed in claim 1, wherein the two outermost boards of the plurality of boards have the integrated circuit and the driving chip at a single side that faces an inner side of the printed circuit board, and other boards among the plurality of boards have the integrated circuit and the driving chip at any side thereof.

6. The display device as claimed in claim 5, wherein two neighboring boards among the plurality of boards have the integrated circuit and the driving chip at sides that face each other.

7. The display device as claimed in claim 5, wherein the printed circuit board includes a connection board disposed as one of the outermost boards among the plurality of boards, and the connection board has a plurality of pad electrodes for connection with the circuit film and a connector for receiving an external signal.

8. The display device as claimed in claim 7, wherein the connection board has a plurality of circuit wires connected with the circuit wires of other boards among the plurality of boards in addition to the circuit wire formed at the side that faces the inner side of the printed circuit board.

9. The display device as claimed in claim 8, wherein the plurality of pad electrodes are formed at an outer side of the connection board, and the plurality of circuit wires formed in the connection board are respectively connected to the plurality of pad electrodes by a conductive filler penetrating the connection board.

10. The display device as claimed in claim 1, wherein the integrated circuit includes one or more of a timing controller, a power management, a DC-DC converter, a level shifter, an EEPROM, or a gamma IC, and the driving chip includes one or more of a resistor, an inductor, or a capacitor.

11. The display device as claimed in claim 1, wherein:
the flexible display panel has a display side,
the printed circuit board is disposed overlapping the flexible display panel at a side opposite of the display side, and
the circuit film is bent toward the opposite side of the flexible display panel.

12. The display device as claimed in claim 1, wherein the flexible display panel is an organic light emitting display panel that includes an organic light emitting diode.

13. The display device as claimed in claim 1, wherein an edge portion of the printed circuit board is between the first and second portions of the circuit film in a vertical direction.

* * * * *